(12) United States Patent
Tomura et al.

(10) Patent No.: US 7,994,638 B2
(45) Date of Patent: Aug. 9, 2011

(54) SEMICONDUCTOR CHIP AND SEMICONDUCTOR DEVICE

(75) Inventors: Yoshihiro Tomura, Osaka (JP); Kazuhiro Nobori, Osaka (JP); Yuichiro Yamada, Osaka (JP); Kentaro Kumazawa, Osaka (JP); Teppei Iwase, Hyogo (JP)

(73) Assignee: Panasonic Corporation, Osaka (JP)

( * ) Notice: Subject to any disclaimer, the term of this patent is extended or adjusted under 35 U.S.C. 154(b) by 160 days.

(21) Appl. No.: 12/531,819

(22) PCT Filed: May 9, 2008

(86) PCT No.: PCT/JP2008/001166
§ 371 (c)(1),
(2), (4) Date: Sep. 17, 2009

(87) PCT Pub. No.: WO2008/142839
PCT Pub. Date: Nov. 27, 2008

(65) Prior Publication Data
US 2010/0032832 A1    Feb. 11, 2010

(30) Foreign Application Priority Data

May 11, 2007   (JP) ................................. 2007-126173

(51) Int. Cl.
*H01L 23/488*        (2006.01)

(52) U.S. Cl. .................. 257/737; 257/773; 257/E23.06; 257/E23.129

(58) Field of Classification Search .................. 257/737, 257/773
See application file for complete search history.

(56) References Cited

FOREIGN PATENT DOCUMENTS

| | | |
|---|---|---|
| JP | 56-56656 | 5/1981 |
| JP | 01-233741 | 9/1989 |
| JP | 03-062927 | 3/1991 |
| JP | 10-303249 | 11/1998 |
| JP | 2000-174050 | 6/2000 |
| JP | 2000-299338 | 10/2000 |
| JP | 2005-503014 | 1/2005 |
| JP | 2006-019497 | 1/2006 |

*Primary Examiner* — Benjamin P Sandvik
*Assistant Examiner* — Krista Soderholm
(74) *Attorney, Agent, or Firm* — Hamre, Schumann, Mueller & Larson, P.C.

(57) ABSTRACT

In this semiconductor chip 3, a table electrode 13 is interposed between a bump electrode 14 and an electrode pad 6. The table electrode 13 is formed by forming a plurality of cores 15 having a smaller Young's modulus than the bump electrode 14, on the electrode pad 6, and then covering the surfaces of the cores 15 with a conductive electrode 16. When the semiconductor chip 3 is flip-chip mounted, the bump electrode 14 is plastically deformed and the table electrode 13 is elastically deformed appropriately, thereby obtaining a good conductive state.

9 Claims, 13 Drawing Sheets

FIG. 9A
PRIOR ART
FIG. 9B
PRIOR ART
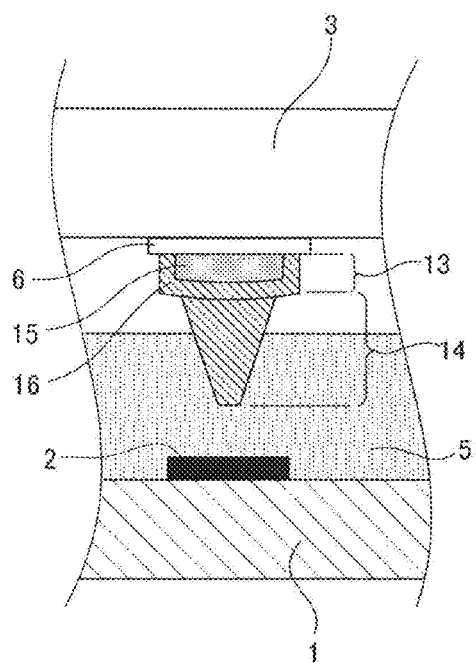
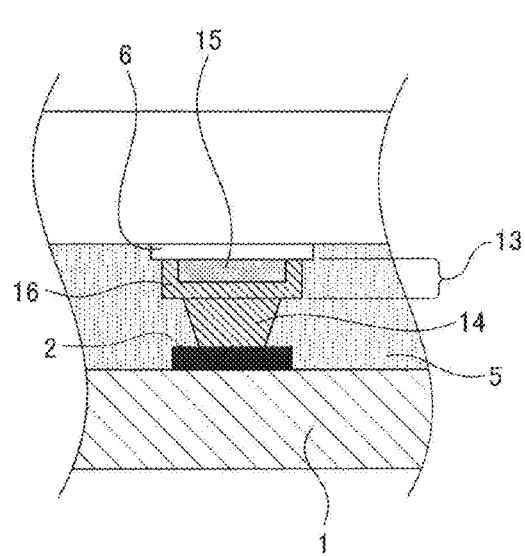

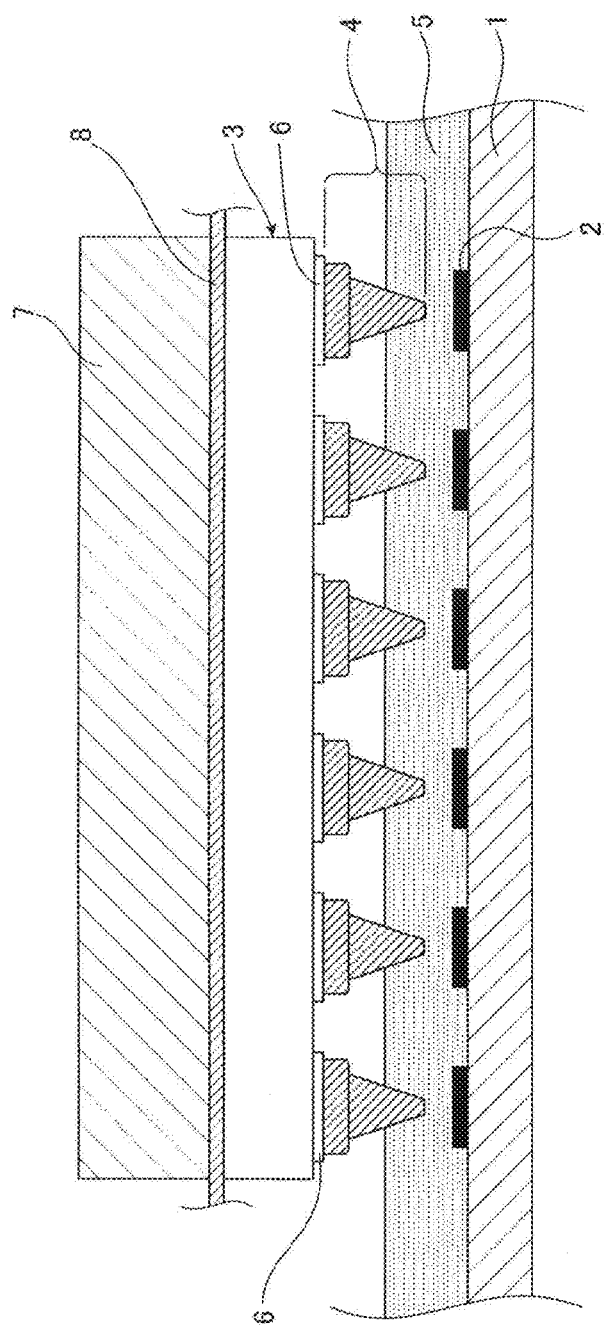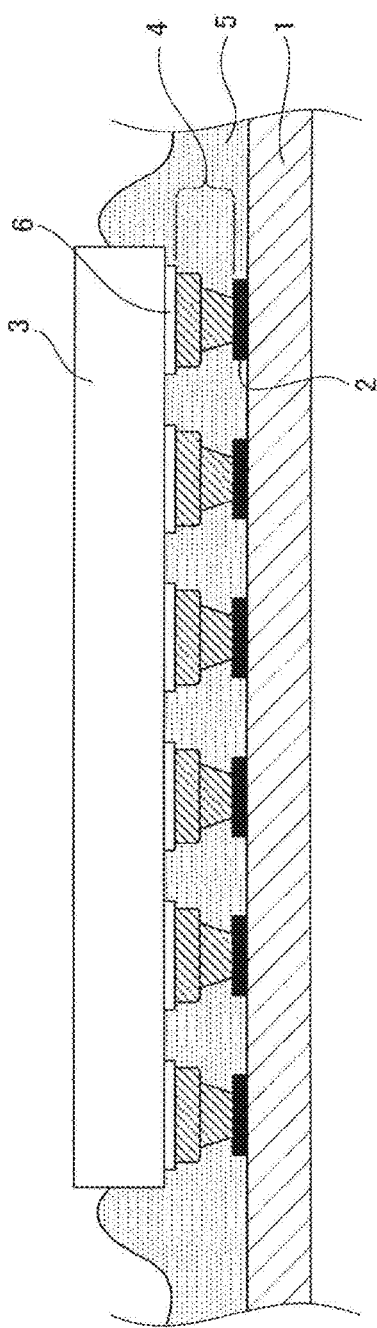
FIG. 10A PRIOR ART
FIG. 10B PRIOR ART

SEMICONDUCTOR CHIP AND SEMICONDUCTOR DEVICE

TECHNICAL FIELD

The invention relates to a semiconductor chip having a bump electrode.

BACKGROUND ART

In recent years, there has been a strong tendency toward reduced size in electronic devices, and progress has been made in enhancing functional integration and accelerating signal processing speeds. In association with this, the wiring of semiconductor chips has become thinner and the insulating layers and wiring layers of semiconductor chips have become more fragile. Furthermore, electrode pitches of 100 µm or less have come to be demanded.

As shown in FIG. 10B, in a semiconductor device which has a semiconductor chip 3 flip-flop mounted onto a wire electrode 2 formed on a substrate 1, a bump electrode 4 formed on the surface of the semiconductor chip 3 is abutted against and electrically connected with the wire electrode 2 and in this state, a thermosetting resin 5 is cured and the position of the semiconductor chip 3 on the substrate 1 is fixed.

More specifically, as shown in FIG. 10A, a wafer on which an electronic circuit is built (not illustrated) is mounted on the semiconductor chip 3, and the bump electrode 4 is formed on an electrode pad 6 which is formed on the surface of the semiconductor chip 3. The bump electrode 4 is formed entirely of gold (Au) which is relatively deformable. The thermosetting resin 5 is applied as an underfill resin to the mounting position of the substrate 1, and the semiconductor chip 3 is pressed against the substrate 1 with the bump electrode 4 facing toward the substrate 1, and the bump electrode 4 is abutted against and electrically connected with the wire electrode 2, in addition to which the shape of the front end thereof is deformed. Moreover, by heating the semiconductor chip 3 by means of a heating tool 7 via a separating sheet 8, in a state where the semiconductor chip 3 is pressed against the substrate 1, the thermosetting resin 5 is cured and fixing is completed.

However, if warping occurs as shown in FIG. 11 in the semiconductor chip 3 after mounting, then a gap 9 arises between the bump electrode 4 and the wire electrode 2, thus giving rise to a connection defect.

It is technically very difficult to mount a semiconductor chip on a wiring substrate using a bump electrode in the case of fragile wiring layers and narrow electrodes which result when the electrode pitch is made narrow. Structures and methods which enable easy assembling even under low load and with narrow pitch have been discussed.

Therefore, Patent Document 1 describes a semiconductor chip 3 wherein, instead of the bump electrode 4 which is formed entirely of gold (Au), a vertically long core 10 made of an insulating material is provided on an electrode pad 6 and a metal film 11 is provided from the surface of the core 10 through to the electrode pad 6.

A semiconductor device in which this semiconductor chip 3 is flip-chip mounted on a substrate 1 is assembled as shown in FIG. 12B and FIG. 12C.

In FIG. 12B, similarly to FIG. 10A and FIG. 10B, by pressing the semiconductor chip 3 against a wire electrode 2 by means of a heat tool 7, the electrode pad 6 is electrically connected with the wire electrode 2 via the metal film 11, and furthermore, by means of this pressing action, elastic deformation is caused so that the height of the core 10 which has had a vertically long shape becomes lower. By heating the thermosetting resin 5 to a curing temperature or higher in this state, the thermosetting resin 5 is cured and the position of the semiconductor chip 3 on the substrate 1 is fixed.

Patent Document 2 describes a semiconductor chip 3 in which an elastic body 20 is formed on an electrode pad 6 as shown in FIG. 13 and a bump electrode 21 is formed thereon.

Technology whereby a semiconductor chip 3 is connected by soldering to a substrate 25, rather than pressing a semiconductor chip 3 against a substrate 1 and in this state electrically connecting the same by curing a thermosetting resin 5, is described in Patent Document 3. As shown in FIG. 14, the semiconductor chip 3 is connected by soldering to a pad 26 of the substrate 25, and a pier 28 made of copper plating is formed on an insulating layer 27 between a pad 6 of the semiconductor chip 3 and low-melting-point solder 23. Resin 29 is filled inside the pier 28. The pad 6 of the semiconductor chip 3 is connected by soldering to the pad 26 of the substrate 25 via a lid 30 which is created by the pier 28 and the plating, and via the low-melting-point solder 23.

Patent Document 1: Japanese Patent Application Laid-Open Publication No. H3-62927 (FIG. 2)

Patent Document 2: Japanese Patent Application Laid-Open Publication No. H1-233741 (FIG. 1)

Patent Document 3: Japanese Patent Application Laid-Open Publication No. 2000-174050 (FIG. 17)

DISCLOSURE OF THE INVENTION

Problem to be Solved by the Invention

In the composition in Patent Document 1, since the semiconductor chip 3 is flip-chip mounted on the substrate 1 in a state where the core 10 is elastically deformed, then if warping has occurred in the semiconductor chip 3 after mounting, this acts so as to recover the shape of the core 10 in a direction which eliminates the gap 9 that occurs in the prior art between the metal layer 11 and the wire electrode 2, thereby improving the rate of occurrence of conduction defects.

However, generally, there remains a problem in that conduction defects are liable to occur due to the occurrence of rupture of the metal film 11 as a result of an increase in the amount of deformation of the core 10 when assembled on the semiconductor device.

This is described in more detail below.

In the composition described in Patent Document 1, since the thin metal layer 11 is formed by sputtering or the like, on the surface of the core 10, then if the core 10 and a projecting electrode consisting of the metal film 11 lean or fall over or if a crack occurs in the metal layer 11 due to large deformation of the core 10 into a spherical shape, when the semiconductor chip 3 is flip-chip mounted, then the electrical connection becomes instable (for instance, the connection resistance varies).

Furthermore, since the core 10 is formed broadly on the electrode pad on the surface of the semiconductor chip, the electrical connection area of the metal layer 11 is small and there is a risk of the connection resistance becoming high.

In the composition described in Patent Document 2, since the elastic body 20 is formed over the electrode pad 6, then although it is possible to reduce a portion of an impact which acts from the bump electrode 21, the impact acts on the electrode pad 6 from the bump electrode 21 without passing through the elastic body 20, and therefore cracks are liable to occur and the electrical resistance becomes instable even in this case.

In the composition described in Patent Document 3, since the low-melting-point solder 23 is melted and solidified to form an electrical connection, elastic deformation of the resin 29 does not occur in a completed state of connection. This Patent Document 3 has the object of avoiding detachment of the pad 6 and the periphery thereof in response to a lateral load after the completion of connection, but does not have the object of damping an impact which occurs in cases where a semiconductor chip 3 is pressed against a substrate 1 and electrically connected in this state by curing a thermosetting resin 5.

The present invention has the object of providing a semiconductor chip and a semiconductor device in which it is possible to achieve a state of good electrical connection with a substrate when the semiconductor chip is pressed against the substrate and electrically connected in this state by curing a resin, rather than connecting the semiconductor chip to the substrate by soldering.

Means for Solving the Problem

In a semiconductor chip according to the present invention, a flat-shaped table electrode having a larger surface area than the tip of a bump electrode, a smaller thickness than the height of the bump electrode and a smaller Young's modulus than the bump electrode is interposed between the bump electrode and an electrode pad formed on the surface of the semiconductor chip; and the table electrode is formed by forming a plurality of cores having a smaller Young's modulus than the bump electrode on top of the electrode pad and covering the surfaces of the cores with a conductive electrode.

More specifically, the plurality of cores are flat and arranged in a ring shape on the electrode pad.

Furthermore, specifically, the plurality of cores are flat cores made of electrically insulating resin or conductive resin and formed on the electrode pad.

Moreover, specifically, the table electrode is formed by disposing the plurality of cores having a smaller Young's modulus than the bump electrode in a distributed fashion separated from one another on the electrode pad, and covering the surfaces of the cores and gaps between the adjacent cores with the conductive electrode.

Furthermore, specifically, in any one of the compositions described above, the planar shape of the semiconductor chip is rectangular, and a plurality of the electrode pads are formed on the surface of the semiconductor chip following the outer shape thereof, and the surface area of the cores in the corner portions of the surface of the semiconductor chip is made greater than the surface area of the cores in the periphery of the corner portions.

Effects of the Invention

By adopting this composition, since a flat-shaped table electrode having a larger surface area than the tip of a bump electrode, a smaller thickness than the height of the bump electrode and a smaller Young's modulus than the bump electrode is interposed between the bump electrode and an electrode pad formed on the surface of a semiconductor chip, and furthermore since the table electrode is formed by forming a plurality of cores having a smaller Young's modulus than the bump electrode on top of the electrode pad and covering the surfaces of the cores with a conductive electrode, then an impact acting on the semiconductor chip when the bump electrode is pressed against a substrate and is deformed plastically can be damped by the table electrode, in addition to which a better state of electrical connection with the substrate can be achieved due to the bump electrode which has a larger Young's modulus deforming to a greater extent than the table electrode which has a smaller Young's modulus.

BRIEF DESCRIPTION OF THE DRAWINGS

FIG. 9A is an enlarged diagram of the mounting of a further embodiment of the present invention;

FIG. 9B is an enlarged diagram of the mounting of a further embodiment of the present invention;

FIG. 10A is a step diagram of the mounting of a semiconductor device according to the prior art;

FIG. 10B is a step diagram of the mounting of the semiconductor device according to the prior art;

EXPLANATION OF EMBODIMENTS

Below, a semiconductor chip according to the present invention is described on the basis of reference modes and specific embodiments.

(First Reference Mode)

FIGS. 1A to 1C, FIG. 2 and FIGS. 3A to 3D show the first reference mode.

Figure 1A:
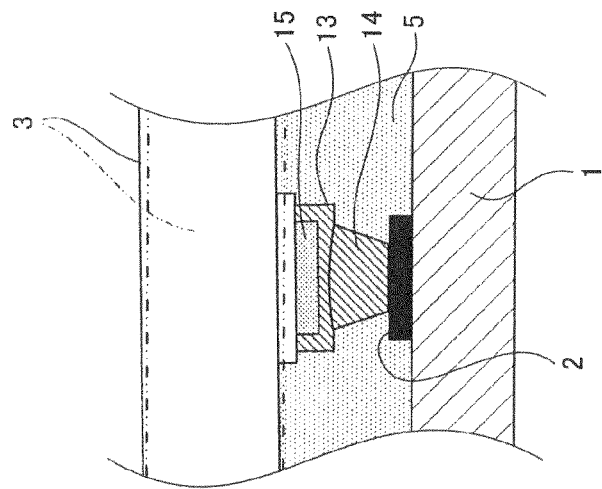
FIG. 1A is an enlarged diagram of a mounting process according to a first reference mode of a semiconductor chip.
Figure 2:
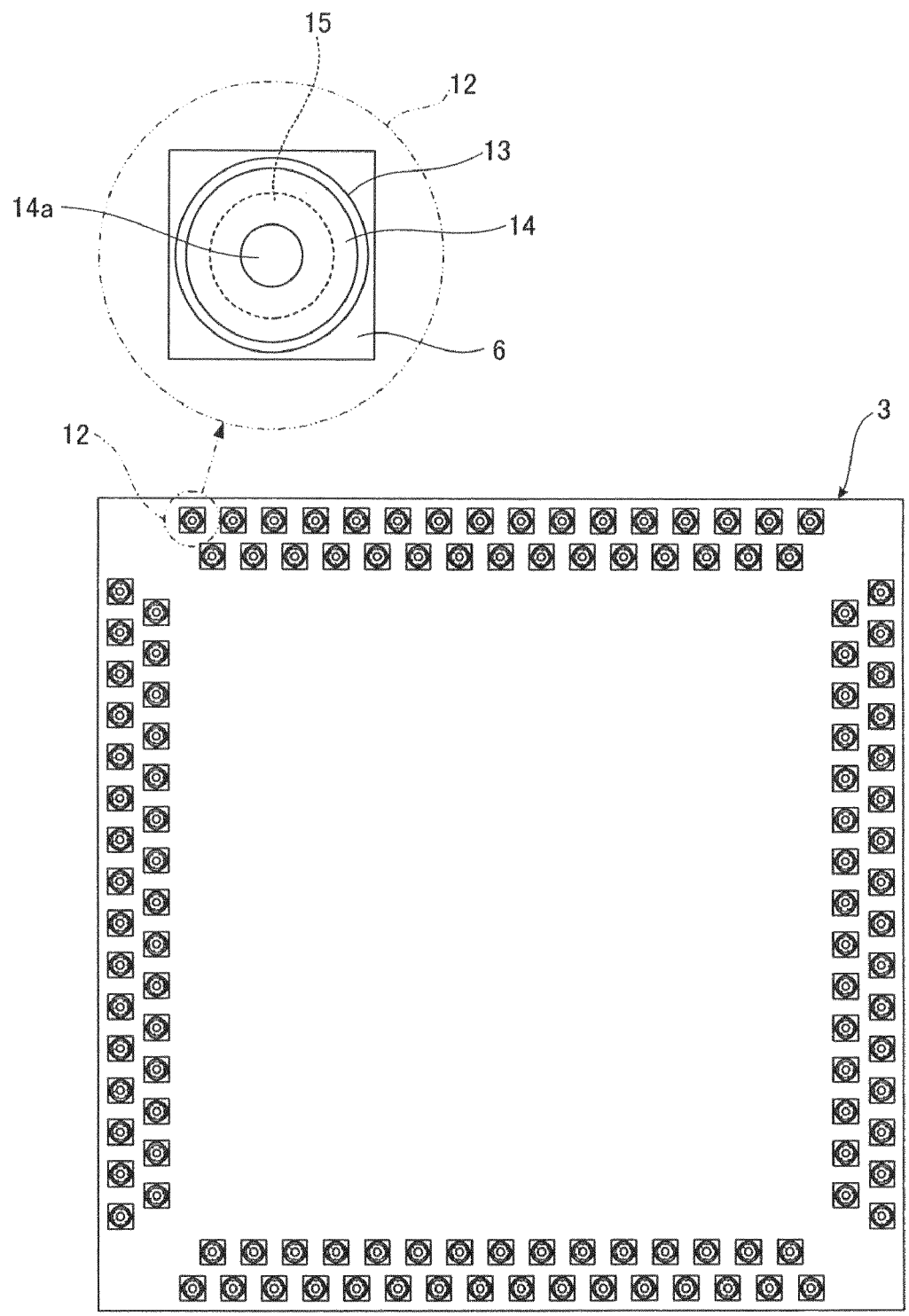
FIG. 2 is an enlarged bottom view of the semiconductor chip according to the first reference mode, and an enlarged view of a bump electrode portion of the same.

FIG. 1A shows a state immediately prior to flip-chip mounting a semiconductor chip 3 on a substrate 1. As shown in FIG. 2, a plurality of electrodes 12 which form connection terminals of a chip (not illustrated) on which an electrical circuit is built are formed on one surface of the semiconductor chip 3.

Each of the electrodes 12 is composed as shown in FIG. 2 and FIG. 1A.

A bump electrode 14 is formed via a table electrode 13 on an electrode pad 6 formed on the surface of the semiconductor chip 3. The bump electrode 14 is formed entirely of a material which deforms relatively easily, for example, gold (the Young's modulus of gold is 78.0 GPa), and the tip end thereof is narrower and more pointed than the base end. This bump electrode 14 deforms plastically under pressure applied during mounting as described below.

The table electrode 13 is formed by covering the surface of a flat core 15 formed on the electrode pad 6 with a conductive electrode 16. The diameter of the core 15 is greater than the diameter of the tip end of the bump electrode 14.

In configuration, the table electrode 13 is thinner than the height of the bump electrode 14 and has a flat shape with a larger surface area than a tip 14a of the bump electrode 14, and more specifically, if the height of the bump electrode 14 is 5 to 50 μm, and the diameter of the tip 14a of the bump electrode 14 is 1 to 43 μm, then the size of the table electrode 13 is 10 to 65 μm in diameter×2 to 5 μm in thickness, and the table electrode 13 has a smaller Young's modulus than the bump electrode 14. More specifically, the ratio between the diameters of the tip end of the bump electrode 14 and the table electrode 13 is desirably 65 to 85%. The core 15 may be made of an insulating resin which forms an elastic body after curing, such as silicone rubber and butadiene rubber, or a semiconductor protective film material, such as polyimide and polybenzoxazole (PBO), and if the core 15 is a protective film material, it can be formed simultaneously with the pre-processing of a semiconductor. For example, the Young's modulus of the silicone rubber used was 160 to 370 MPa.

FIG. 3A to FIG. 3D show steps of manufacturing the table electrode 13 and the bump electrode 14.

Figure 3A:
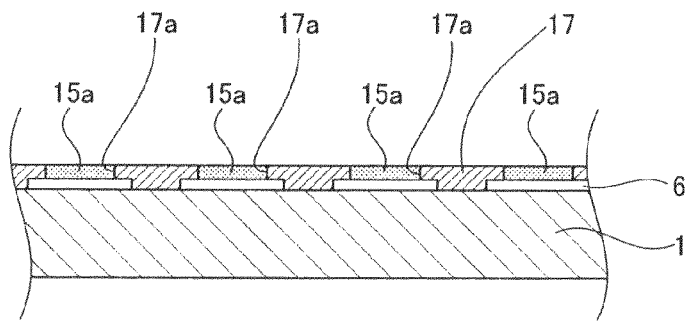
FIG. 3A is a step diagram of the formation of bump electrodes according to the first reference mode.

In FIG. 3A, after forming photoresist 17 on the semiconductor chip 3 and curing, the photoresist 17 is dry-etched or etched using an alkali solution, thereby exposing a portion of each respective electrode pad 6 of the semiconductor chip 3, and window portions 17a of the photoresist 17 are then filled by printing or transferring a material 15a that is to form the core 15. By then removing the photoresist 17, the core 15 is formed on each electrode pad 6.

Figure 3B:
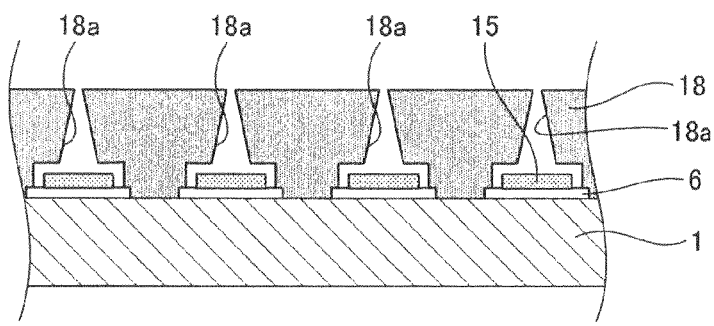
FIG. 3B is a step diagram of the formation of the bump electrodes according to the first reference mode.

In FIG. 3B, photoresist 18 which creates a mold for the shapes of the bump electrode 14 and the conductive electrode 16 is formed.

Figure 3C:
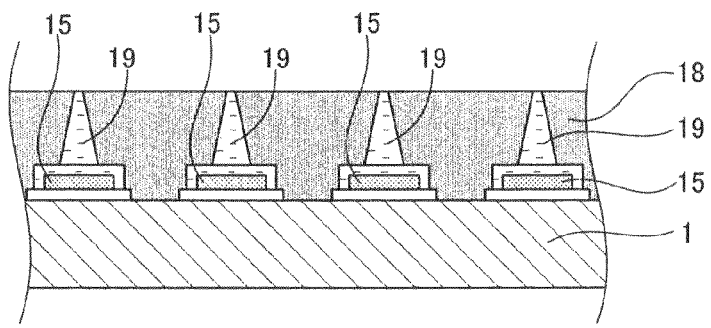
FIG. 3C is a step diagram of the formation of the bump electrodes according to the first reference mode.

In FIG. 3C, a plating solution 19 is introduced by electroless plating into a mold 18a in the photoresist 18, thereby forming a conductive electrode 16 situated on the outer side of the core 15, and a bump electrode 14.

Figure 3D:
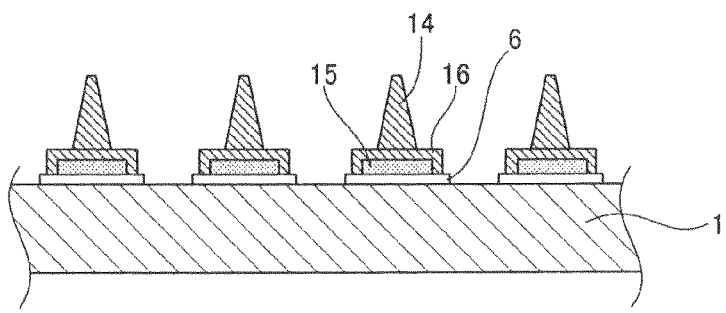
FIG. 3D is a step diagram of the formation of the bump electrodes according to the first reference mode.

In FIG. 3D, the photoresist 18 is removed with an alkali solution or the like, and a two-step bump can be obtained in which the bump electrode 14 is formed on the table electrode 13 which internally contains the core 15. In other words, a semiconductor chip 3 which has the table electrode 13 interposed between the bump electrode 14 and the electrode pad 6 is completed.

The substrate 1 is formed of a glass epoxy substrate, a silicon substrate, a silicon interposer, or the like.

Figure 1B:
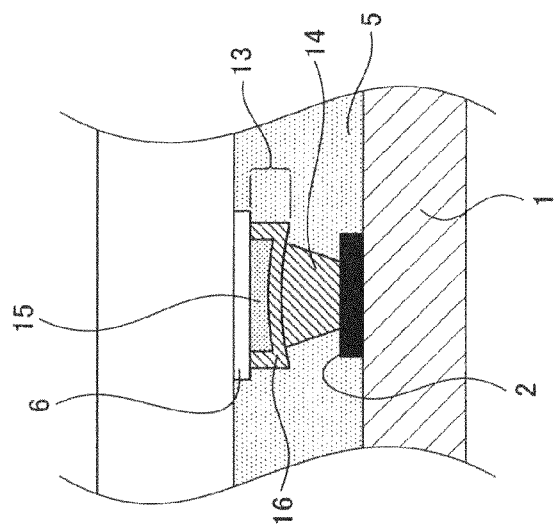
FIG. 1B is an enlarged diagram of the mounting process according to the first reference mode.

By pressing the semiconductor chip 3 formed with table electrodes 13 and the bump electrodes 14 in this way at the mounting position of the substrate 1 in the same step shown in FIGS. 10A and 10B and then heating the semiconductor chip 3 with a heat tool 7 via a separating sheet 8, a thermosetting resin 5 is cured and fixing is completed as shown in FIG. 1B.

Figure 1C:
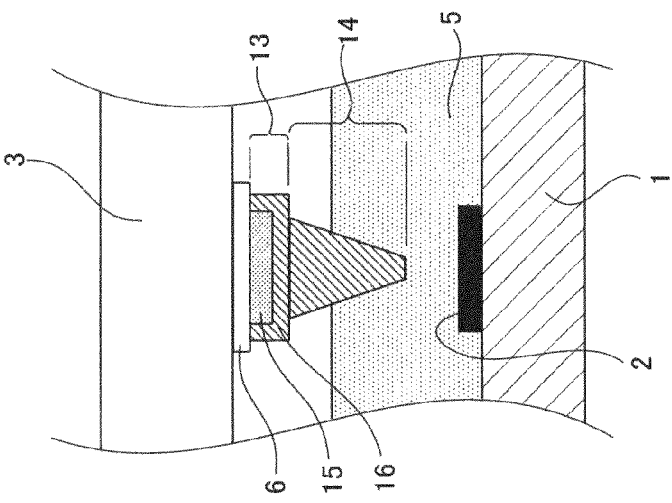
FIG. 1C is an enlarged diagram of the mounting process according to the first reference mode.

Even if warping occurs as shown in FIG. 1C in the semiconductor chip 3 after flip-chip mounting of the semiconductor chip 3 on the substrate 1, an urging force acting on the core 15 which has elastically deformed is eliminated, the core 15 returns to the original shape, the bump electrode 14 is pushed out toward a wire electrode 2 of the substrate 1, and it is possible to maintain a good conductive state over a long period of time similarly to Patent Document 1, without the occurrence of a gap 9 between the bump electrode 14 and the wire electrode 2.

Furthermore, in the mounted state shown in FIG. 1B, the bump electrode 14 abuts against the wire electrode 2 and the tip thereof deforms plastically, in addition to which the core 15 deforms elastically and the table electrode 13 deforms elastically. In respect of the electrical connection between the electrode pad 6 of the semiconductor chip 3 and the wire electrode 2 of the substrate 1, a large electrical connection surface area can be secured between the electrode pad of the semiconductor chip and the table electrode, and furthermore, good conduction is achieved via the conductive electrode 16 which covers the plastically deformed bump electrode 14 and the surface of the flat-shaped core 15.

(Second Reference Mode)

Figure 4A:
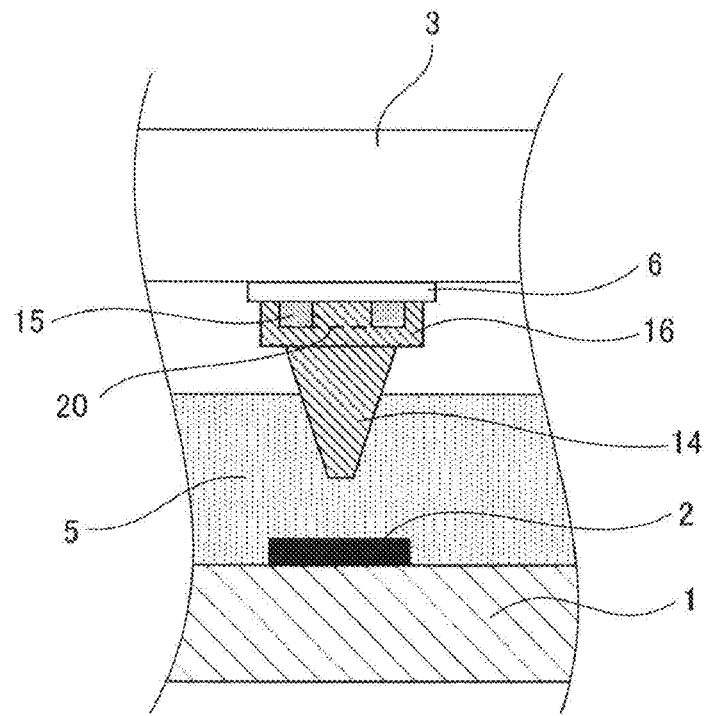
FIG. 4A is an enlarged cross-sectional view immediately before mounting according to a second reference mode of the semiconductor chip.
Figure 4B:
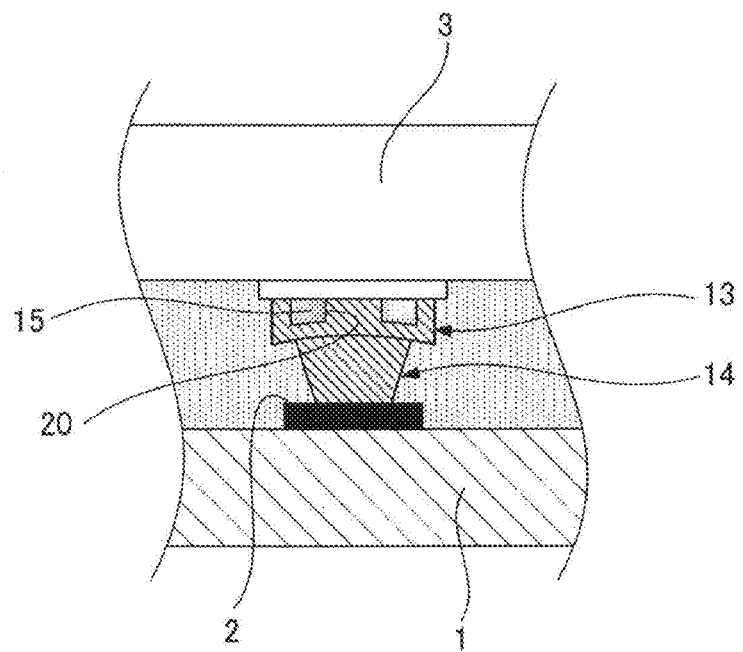
FIG. 4B is an enlarged cross-sectional view of the second reference mode.

FIG. 4A and FIG. 4B show the second reference mode.

The core 15 of the table electrode 13 in the first reference mode is flat disk-shaped, but a core 15 of a table electrode 13 according to the second reference mode shown in FIG. 4A and FIG. 4B is finished in a flat ring shape with a hole 20 formed in the center thereof; when the table electrode 13 is formed by forming a conductive electrode 16 on top of the core 15, the conductive electrode 16 enters into the hole 20, thereby ensuring a shortest electrical path in addition to the peripheral region of the core 15, and hence it is possible to obtain an electrical connection while receiving a deformation load in the tip portion.

(Third Reference Mode)

Figure 5A:
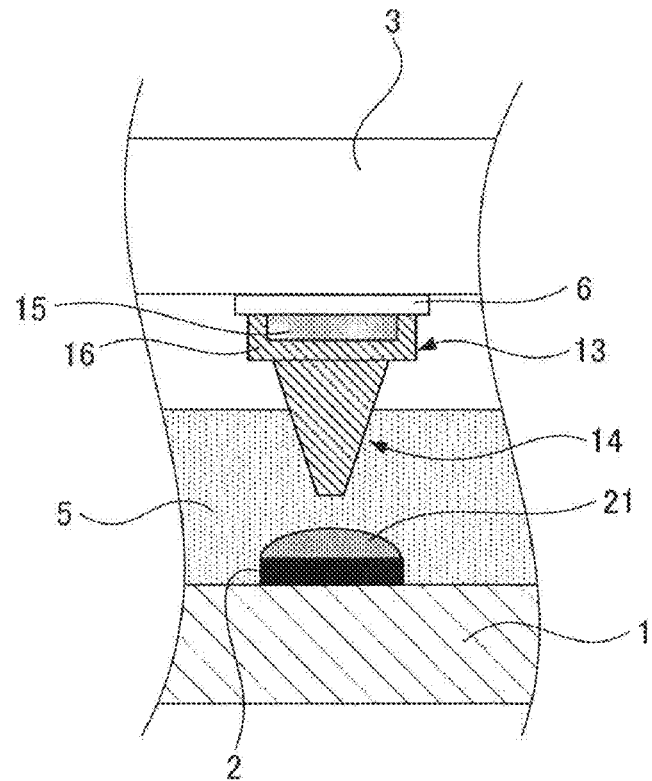
FIG. 5A is an enlarged cross-sectional view immediately before mounting according to a third reference mode of the semiconductor chip.
Figure 5B:
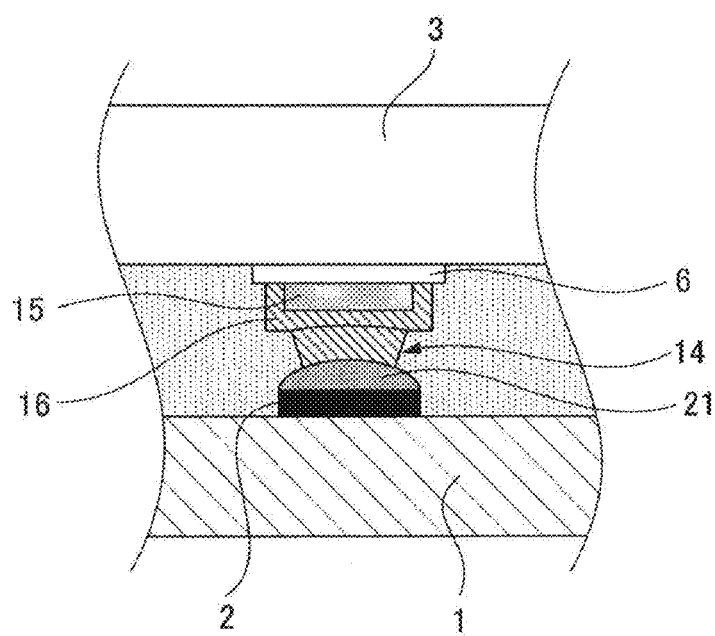
FIG. 5B is an enlarged cross-sectional view of the third reference mode.

FIG. 5A and FIG. 5B show the third reference mode.

It is desirable in terms of the electrical connection that gold (Au) should be used as the material of the bump electrode 14 and the conductive electrode 16 of the table electrode 13 according to each of the reference modes, but metallization with Cu—Ni—Au, Cr—Au, Ti—Pd—Au, or the like, is also possible.

Here, a case is described in which copper (Cu) which is not suitable for crimping connection due to oxidation is used for the bump electrode 14 and the conductive electrode 16 of the table electrode 13. In this case, solder 21 is applied previously onto a wire electrode 2 of a substrate 1, as shown in FIG. 5A, and by pressing at the mounting position of the substrate 1 and heating a semiconductor chip 3 with a heat tool 7 via a heat resistant sheet 8 in the same steps as those shown in FIG. 10A and FIG. 10B, a gap between the wire electrode 2 and the bump electrode 14 which is deformed by the pressing action is soldered by the solder 21, which melts before a thermosetting resin 5 cures due to the heating by the heat tool 7, whereupon the thermosetting resin 5 subsequently cures, thus completing fixing as shown in FIG. 5(b).

In this way, even if copper (Cu) which is not suitable for crimping connection due to oxidation is used for the bump electrode 14 and the conductive electrode 16 of the table electrode 13, it is possible to obtain an electrical connection of high reliability by metallic bonding of the gap between the wire electrode 2 and the bump electrode 14 with solder.

First Embodiment

Figure 6A:
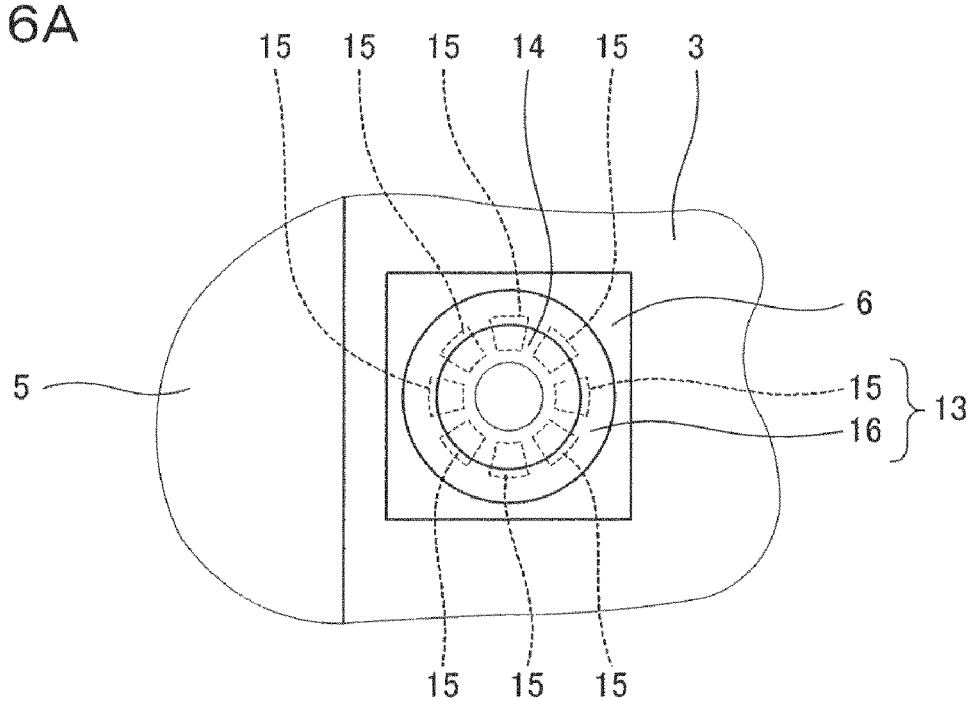
FIG. 6A is an enlarged plan view of an electrode according to a first embodiment of the present invention.
Figure 6B:
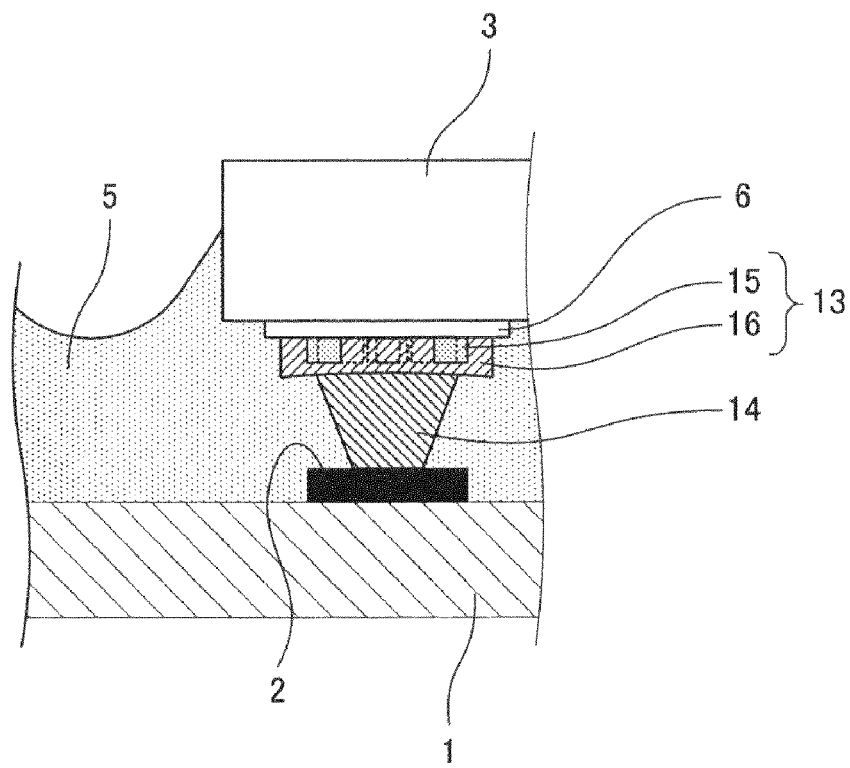
FIG. 6B is an enlarged cross-sectional view of a semiconductor device according to the first embodiment.

FIG. 6A and FIG. 6B show the first embodiment of the present invention.

The core 15 of the table electrode 13 in the first reference mode is a flat disk-shaped, and the core 15 of the table electrode 13 in the second reference mode is in a ring shape, but as shown in FIG. 6A and FIG. 6B, it is also possible to provide a plurality of cores 15 having a smaller Young's modulus than a bump electrode 14 in a distributed fashion separated from one another on an electrode pad 6 formed on the surface of a semiconductor chip, and to cover the surfaces of the cores 15 and the gaps between the adjacent cores 15 with a conductive electrode 16.

By providing the plurality of cores 15 having a smaller Young's modulus than the bump electrode 14 in a distributed fashion separated from one another on the electrode pad 6 formed on the surface of the semiconductor chip, it is possible to distribute the stress due to the cores 15 being more liable to deform, compared to a case where cores 15 are formed without being separated from one another, and furthermore, the stress between the adjacent cores due to a difference in thermal expansion between the cores 15 and the conductive electrode 16 can be reduced, and damage to elements below the electrode pad 6 can be reduced.

Figure 7A:
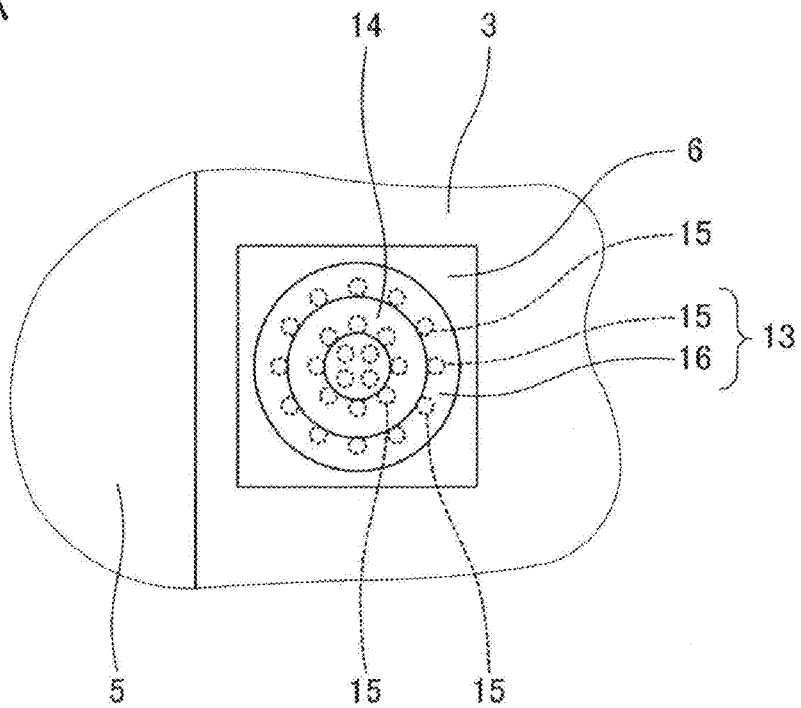
FIG. 7A is an enlarged plan view of the electrode showing a further specific example of the first embodiment.
Figure 7B:
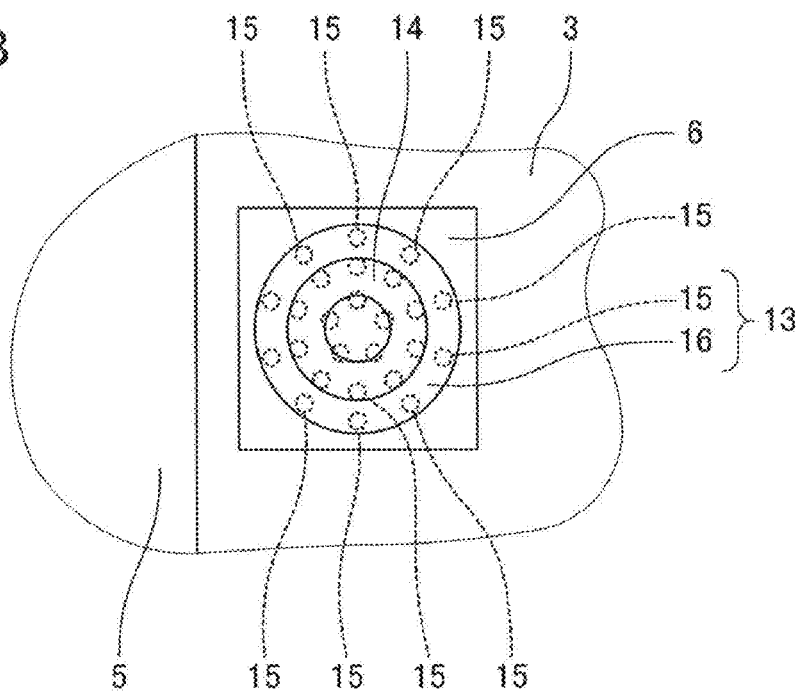
FIG. 7B is an enlarged plan view of the electrode showing a further specific example of the first embodiment.

FIG. 7A and FIG. 7B respectively show separate specific examples where a plurality of cores 15 are disposed in a distributed fashion separated from one another on the electrode pad 6.

Second Embodiment

Figure 8:
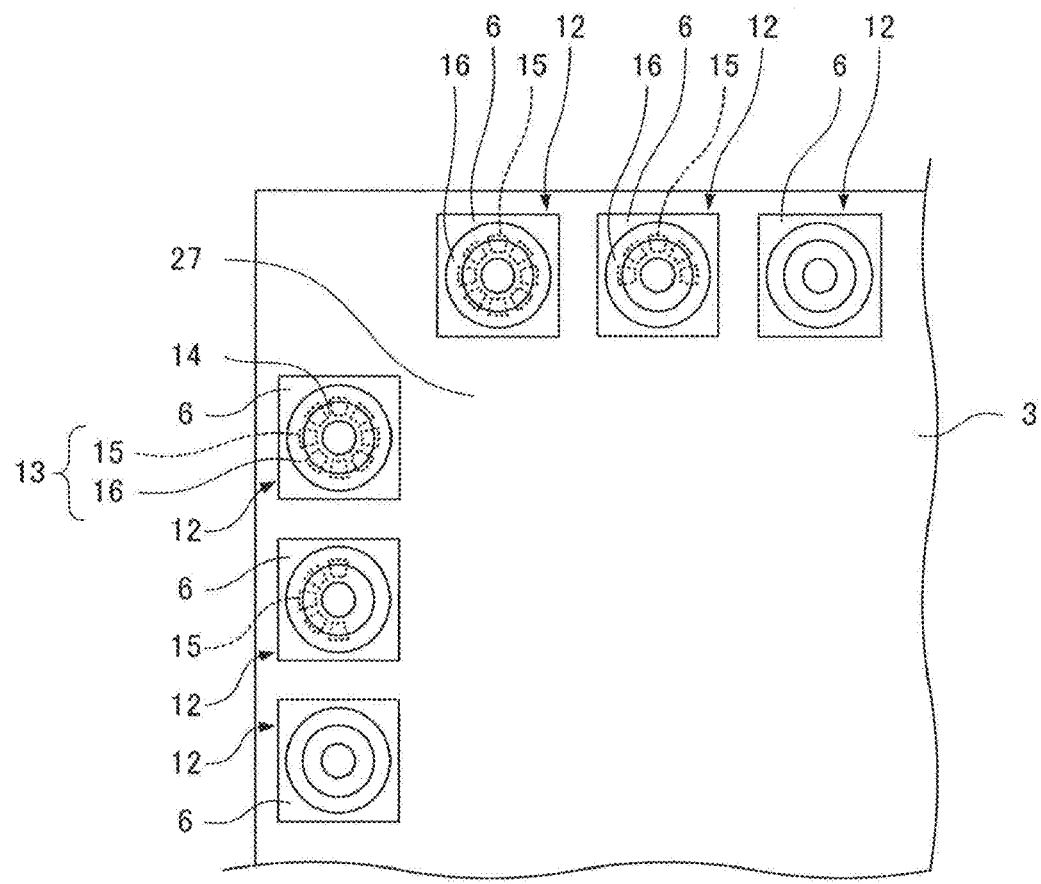
FIG. 8 is an enlarged plan view of an electrode according to a second embodiment of the present invention.
Figure 11:
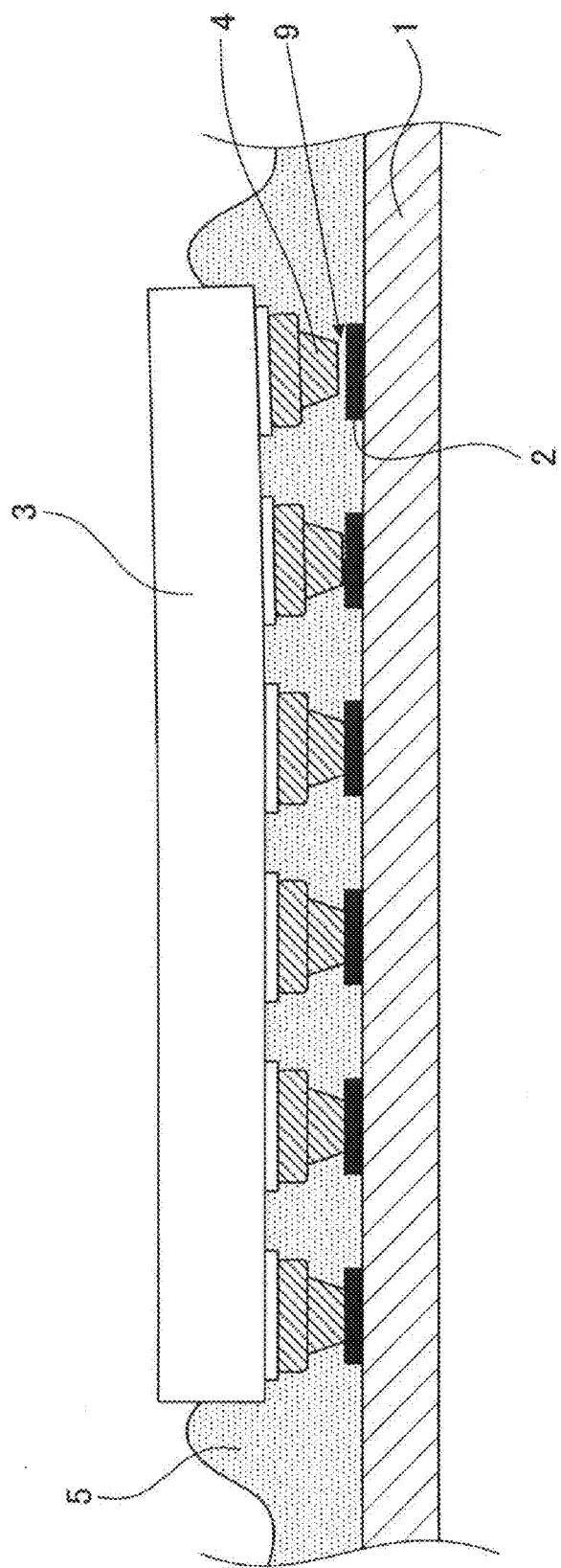
FIG. 11 is an explanatory diagram illustrating a case where a substrate is deformed in the prior art.
Figure 12A:
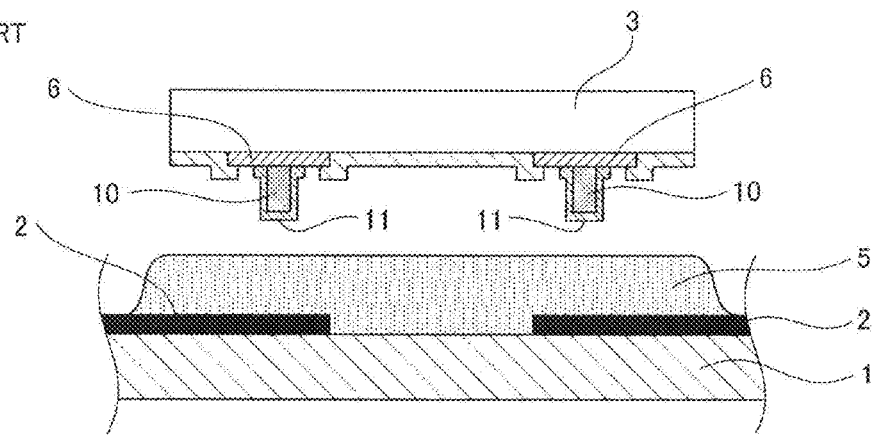
FIG. 12A is a step diagram of the mounting of a semiconductor chip as seen in Patent Document 1.
Figure 12B:
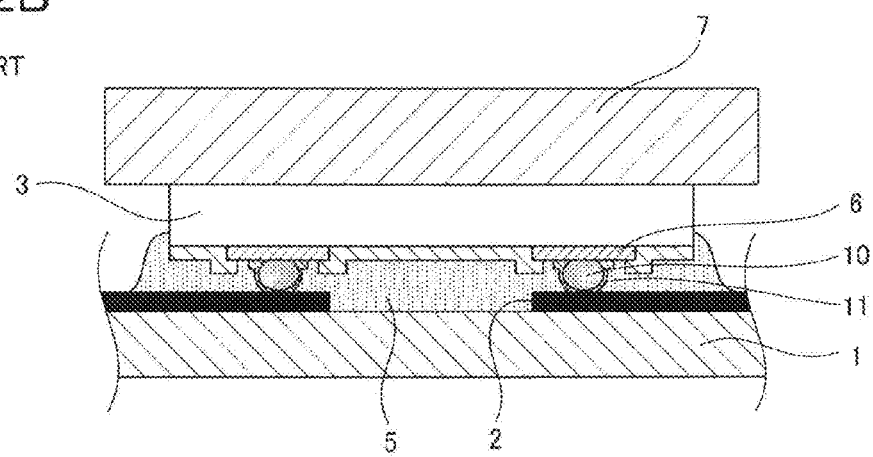
FIG. 12B is a step diagram of the mounting of the semiconductor chip as seen in Patent Document 1.
Figure 12C:
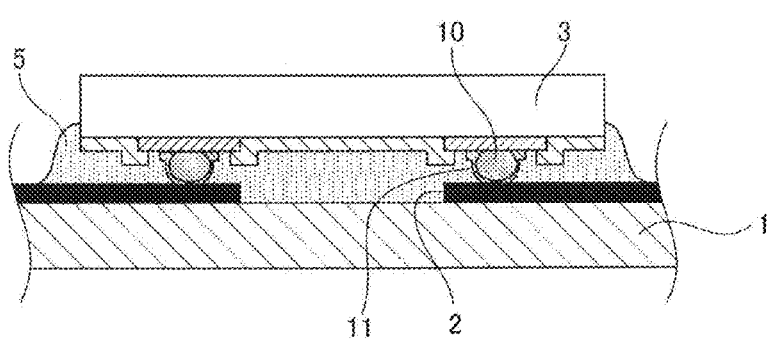
FIG. 12C is a step diagram of the mounting of the semiconductor chip as seen in Patent Document 1.
Figure 13:
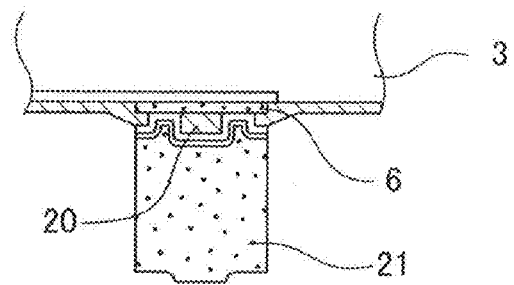
FIG. 13 is a cross-sectional diagram of a semiconductor chip as seen in Patent Document 2.
Figure 14:
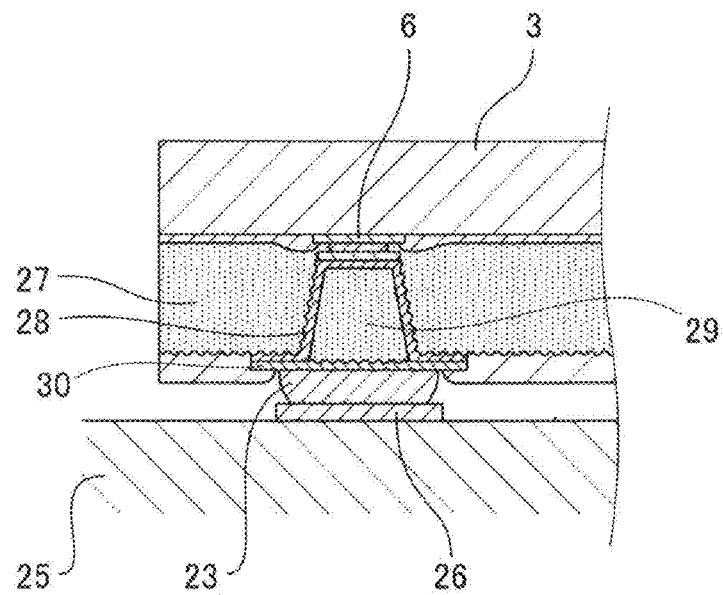
FIG. 14 is a cross-sectional diagram of a semiconductor device as seen in Patent Document 3.

FIG. 8 shows the second embodiment of the present invention.

Similarly to FIG. 2, FIG. 8 shows a state immediately prior to flip-chip mounting a semiconductor chip 3 on a substrate 1. A plurality of electrodes 12 which are to form connection terminals of the chip on which an electrical circuit is built are formed on the surface of the semiconductor chip 3, the planar shape of the electrodes 12 following the outer shape of the rectangular semiconductor chip 3. In FIG. 8, in the electrodes 12 in corner portions 27 of the surface of the semiconductor chip, the total surface area of a plurality of cores 15 within a table electrode 13 is made greater than the total surface area of the plurality of cores 15 within the table electrode 13 of the electrode 12 located at the periphery of the corner portion 27.

In this way, furthermore, the nearer the position of the electrode 12 to the corner portion 27 which is subject to the effects of stress, the greater the total surface area of the plurality of cores 15 within the table electrode 13, and therefore improvement in the action of alleviating stress can be anticipated.

FIG. 8 shows a diagram of an example of the table electrode 13 in a case where the cores 15 are disposed in a distributed fashion separated from one another as explained in the first embodiment, but the same applies to other embodiments.

In the reference modes shown in FIGS. 1A to 1C, FIG. 2, and FIGS. 3A to 3D, the surface of the core 15 on the opposite side to the bonding surface with the pad 6 is flat and the surface of the table electrode 13 on the side of the bump electrode 14 is also flat, but as shown in FIG. 9A, it is also possible to make the surface of the core 15 on the opposite side to the bonding surface with the pad 6 project in the central portion thereof, and to form the surface of the table electrode 13 on the bump electrode 14 side to project in the central portion thereof. In this case, the impact acting via the bump electrode 14 acts on the center of the table electrode 13 and then gradually acts in a distributed fashion toward the outer circumferential side of the table electrode 13, causing the core 15 to deform elastically and adopt the connected state shown in FIG. 9B, and therefore the effect in damping the impact load is further improved.

The cores 15 of the table electrodes 13 according to the respective embodiments described above are made of an elastic material consisting of an insulating resin, but it is also possible to form the cores 15 of a conductive adhesive which includes a conductive resin and conductive filler. By making the cores 15 conductive, it is possible to improve the reliability of the electrical connection.

In the respective embodiments described above, the semiconductor chip 3 and the substrate 1 are fixed together with the thermosetting resin 5, but it is also possible to use a thermoplastic resin instead of the thermosetting resin, or to make combined use of an ultraviolet curable resin. More specifically, it is possible to use an epoxy resin, a polyallyl ether resin, a polyamide resin, a polyester resin, a polyimide resin, or the like, as a suitable resin material.

The present invention achieves good conduction in flip-chip mounting at fine pitch, and is able to contribute to increasing functional integration of semiconductor devices of various types.

The invention claimed is:

1. A semiconductor chip, wherein a flat-shaped table electrode having a larger surface area than a tip of a bump electrode, a smaller thickness than a height of the bump electrode and a smaller Young's modulus than the bump electrode is interposed between the bump electrode and an electrode pad formed on a surface of the semiconductor chip, and the table electrode is formed by forming a plurality of cores having a smaller Young's modulus than the bump electrode on top of the electrode pad and covering surfaces of the cores with a conductive electrode.

2. The semiconductor chip according to claim 1, wherein the plurality of cores are flat and arranged in a ring shape on the electrode pad.

3. The semiconductor chip according to claim 1, wherein the plurality of cores are flat cores made of electrically insulating resin or conductive resin and formed on the electrode pad.

4. The semiconductor chip according to claim 1, wherein the table electrode is formed by disposing the plurality of cores having a smaller Young's modulus than the bump electrode in a distributed fashion separated from one another on the electrode pad, and covering the surfaces of the cores and gaps between the adjacent cores with the conductive electrode.

5. The semiconductor chip according to claim 1, wherein a planar shape of the semiconductor chip is rectangular, a plurality of the electrode pads are formed on the surface of the semiconductor chip following an outer shape thereof, and a surface area of the cores in corner portions of the surface of the semiconductor chip is made greater than a surface area of the cores in a periphery of the corner portions.

6. The semiconductor chip according to claim 1, wherein a planar shape of the semiconductor chip is rectangular, a plurality of the electrode pads are formed on the surface of the semiconductor chip following an outer shape thereof, the plurality of cores are flat and arranged in a ring shape on the electrode pad, and a surface area of the cores in corner portions of the surface of the semiconductor chip is made greater than a surface area of the cores in a periphery of the corner portions.

7. The semiconductor chip according to claim 1, wherein a planar shape of the semiconductor chip is rectangular, and a plurality of the electrode pads are formed on the surface of the semiconductor chip following an outer shape thereof, the plurality of cores are flat cores made of electrically insulating resin or conductive resin and formed on the electrode pad, and a surface area of the cores in corner portions of the surface of the semiconductor chip is made greater than a surface area of the cores in a periphery of the corner portions.

8. The semiconductor chip according to claim 1, wherein a planar shape of the semiconductor chip is rectangular, and a plurality of the electrode pads are formed on the surface of the semiconductor chip following an outer shape thereof, the plurality of cores are formed by disposing the plurality of cores having a smaller Young's modulus than the bump electrode in a distributed fashion separated from one another on the electrode pad, and covering the surfaces of the cores and gaps between the adjacent cores with the conductive electrode, and a surface area of the cores in corner portions of the surface of the semiconductor chip is made greater than a surface area of the cores in a periphery of the corner portions.

9. A semiconductor device in which the bump electrode of the semiconductor chip according to claim 1 is connected via an underfill resin to a wire electrode on a substrate.

* * * * *